(12) United States Patent
Steegmann et al.

(10) Patent No.: US 7,446,645 B2
(45) Date of Patent: Nov. 4, 2008

(54) DEVICE FOR OPERATING ELECTRICAL OR ELECTROMECHANICAL ENTRY OR ACCESS SYSTEMS ON OR IN A VEHICLE

(75) Inventors: Bernd Steegmann, Heiligenhaus (DE); Martin Witte, Ahaus (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 141 days.

(21) Appl. No.: 11/587,844

(22) PCT Filed: Apr. 5, 2005

(86) PCT No.: PCT/EP2005/003554

§ 371 (c)(1),
(2), (4) Date: Oct. 28, 2006

(87) PCT Pub. No.: WO2005/108175

PCT Pub. Date: Nov. 17, 2005

(65) Prior Publication Data

US 2007/0247275 A1    Oct. 25, 2007

(30) Foreign Application Priority Data

Apr. 30, 2004    (DE) .................. 10 2004 021 505

(51) Int. Cl.
*B60R 25/00*    (2006.01)

(52) U.S. Cl. .................. 340/5.72; 340/5.7; 340/5.6

(58) Field of Classification Search ................ 340/5.72, 340/5.7, 5.6, 5.61, 5.64, 5.65, 5.1, 5.2
See application file for complete search history.

(56) References Cited

U.S. PATENT DOCUMENTS 7,173,520 B2 *    2/2007    Desai et al. .................. 340/442

* cited by examiner

*Primary Examiner*—George A Bugg
*Assistant Examiner*—Travis R Hunnings
(74) *Attorney, Agent, or Firm*—Friedrich Kueffner

(57) ABSTRACT

The invention relates to a device for operating electrical or electromechanical devices (10) in a vehicle, whereby a sensor (40) is used, operating on proximity or contact. According to the invention, the device can distinguish whether operation of the sensor (40) is actually carried out by a human hand, or by erroneous objects, whereby, in an initial adjustment phase, the device records at least one set of data for each signal and stores the same in a memory, which occur at at least some defined timepoints during the signal time course of the corresponding sensor (40). A set of operationally-typical valid data and/or a set of error-typical invalid data is thus obtained. During the subsequent operational phase for the device, an actual data set of analogue signals for the corresponding sensor (40) is recorded during the time course at the same defined timepoints as for the adjustment phase. Said actual data set is compared by a controller with at least one of the stored data sets. Operation of the device (10) is thus only permitted by the controller (44), when the actual data set matches the valid data set and/or is not contained within the invalid data set.

15 Claims, 4 Drawing Sheets

DEVICE FOR OPERATING ELECTRICAL OR ELECTROMECHANICAL ENTRY OR ACCESS SYSTEMS ON OR IN A VEHICLE

The invention pertains to an arrangement of the type indicated in the introductory clause of claim 1. The sensor of the arrangement responds to approach or to contact.

It is known from DE 196 17 038 C2 that a capacitive sensor, which responds only when an authorized person approaches it, can be provided in a closing device of a vehicle. In the case of this known arrangement, the authorized person carries an identification transmitter (ID transmitter), to which an identification receiver (ID receiver) in the vehicle is assigned. When the person's hand approaches the sensor, a change in the capacitance occurs, which is detected by the sensor. If the person in question is authorized, data communications begin between the ID transmitter and the ID receiver. The actual data received are compared with nominal data in a memory unit. If the comparison is successful, the actuation function of the closing device is switched to an active state even before the handle of the closing device is in fact actuated by the authorized person. The person who actuates the handle notices nothing of these communications or of this data comparison. The door or hatch is opened and closed without any delay.

So that no unnecessary, energy-consuming communication takes place, a sensor should not respond to the approach of, or to contact by, any object at all but rather only to the approach of, or to contact by, a human hand. It is undesirable for any random external influence such as rain, snow, ice, or leaves to result in the actuation of the device. To solve this problem, a closing device with a capacitive sensor known from DE 196 20 059 A1 also determines the speed at which the capacitance changes when an object approaches or makes contact. In this known arrangement, use is made of the circumstance that the change in capacitance per unit time is greater upon the approach of a human hand to the sensor than upon the approach of foreign objects. When the change in capacitance per unit time is measured, the actuation function of the closing device is switched to an active state only if the change in capacitance over time exceeds a certain limit value. This method cannot be used in all cases, however.

A keyless actuation device for motor vehicles which provides two or more sensors to exclude the possibility that the operating function could be initiated mistakenly is known from WO 03/095776 A1. These sensors initiate one or more operating functions in the vehicle. Different operating functions are initiated as a function of the time pattern of the actuation of these multiple sensors. This excludes the possibility that operating functions could be initiated mistakenly when, for example, the user leans against the vehicle without paying attention and thus inadvertently initiates the start of the data acquisition process.

A process and an arrangement for evaluating contact is known from DE 42 22 990 A1, so that movable parts can be handled mechanically in a more effective manner, e.g., drives, merchandise transport devices, and counting devices for piece goods. Two surfaces of the moving parts are contacted, so that energy can be supplied to the moved part to generate mechanical vibration in it. This vibration is then scanned electronically or physically. Contact between the moved part and some other part has an effect on the amplitude and frequency of the vibration, which is evaluated. It is not stated that this process or a modification of it can be used to release arrangements in or on a vehicle. Encoded data are not transmitted.

The invention is based on the task of developing a reliable arrangement of the type indicated in the introductory clause of claim 1 which differentiates clearly between actuation of the sensor by a human hand and actuation by foreign objects, and which accordingly releases or does not release the actuation function of the device. This is achieved according to the invention by the measures cited in claim 1, to which the following special meaning attaches.

The invention monitors the time change in the signals which are received when an object approaches or contacts a sensor. The invention has discovered that the signal curve generated by a human hand at the sensor differs considerably from the time change in all other signals generated by foreign objects such as leaves, rain, snow, etc., when they approach or contact the sensor. The inventive arrangement is able to learn. In an initial setup phase, the sensor is allowed to respond to various objects, so that the arrangement can record sets of signal data, which are obtained at defined points during the course of the signal. These data sets are then stored in memory. When the hands of various people approach or contact the sensor in various ways, several sets of data typical of actuation are acquired; in the following, these data sets are called "good data". Alternatively or in addition, it is also possible to acquire and to store signal data obtained at the same defined points during the course of an analogous signal generated by the approach of foreign objects to the sensor. Such data sets typical of foreign objects are to be called "bad data".

After this setup phase, the actual duty phase of the arrangement can begin. When the sensor responds now, the course of the actual signal being obtained is also recorded at the same defined points as during the setup phase. To determine whether the recorded values are to be assigned to a good data set or to a bad data set, the controller simply compares the actual data set received with at least one of the stored data sets. Depending on the result of the comparison, the controller either releases the actuation function or switches it to an inactive state. The intelligence of the inventive arrangement can be increased by storing a large number of such good and/or bad data sets. In actual use, the arrangement can then determine very accurately whether the right object, namely, the human hand, or a foreign object has caused the sensor to respond. On the basis of its intelligence, the arrangement can even tell what type of foreign object has activated the sensor.

It would also be possible to allow the setup phase of the arrangement to continue during the duty phase as well and thus to increase the intelligence of the inventive arrangement even more over the course of time. When the sensor responds but the device is not in fact actuated, the arrangement recognizes that the object in question is a foreign object. The arrangement can then file the data set in question as another example of "bad data" in its memory. As a result, the memory has grown and can distinguish even more accurately between good data and bad data as future events occur.

Because the data comparison takes a certain amount of time, it is recommended, according to claim 12, that the device be released as soon as the actual data arrive but not in fact completely actuated. If, during the course of the further evaluation of the actual data, it is found that the data set in question is bad, the activation of the actuation function is cancelled, and further actuation is rendered impossible. In the opposite case, namely, if the data have been determined to be good, the actuation of the device can be completed immediately, because the actuation function of the device has already been switched to an active state. This offers the advantage that the device can react very soon after it has been actuated.

Additional measures and advantages of the invention can be derived from the subclaims, from the following description, and from the drawings. The drawings illustrate the invention schematically on the basis of an exemplary embodiment:

FIG. 1 shows an essentially horizontal longitudinal cross section through an external door handle of a vehicle in which the inventive arrangement is realized; the viewing direction is indicated by the cross-sectional line I-I of FIG. 2; and FIG. 2 shows a vertical longitudinal cross section through the external door handle shown in FIG. 1 along the cross-sectional line II-II in that figure.

The following figures show the time change in the signal in the sensor circuit as various objects approach the sensor. Specifically, these figures show the voltage as a function of time, namely:

Figure 1:
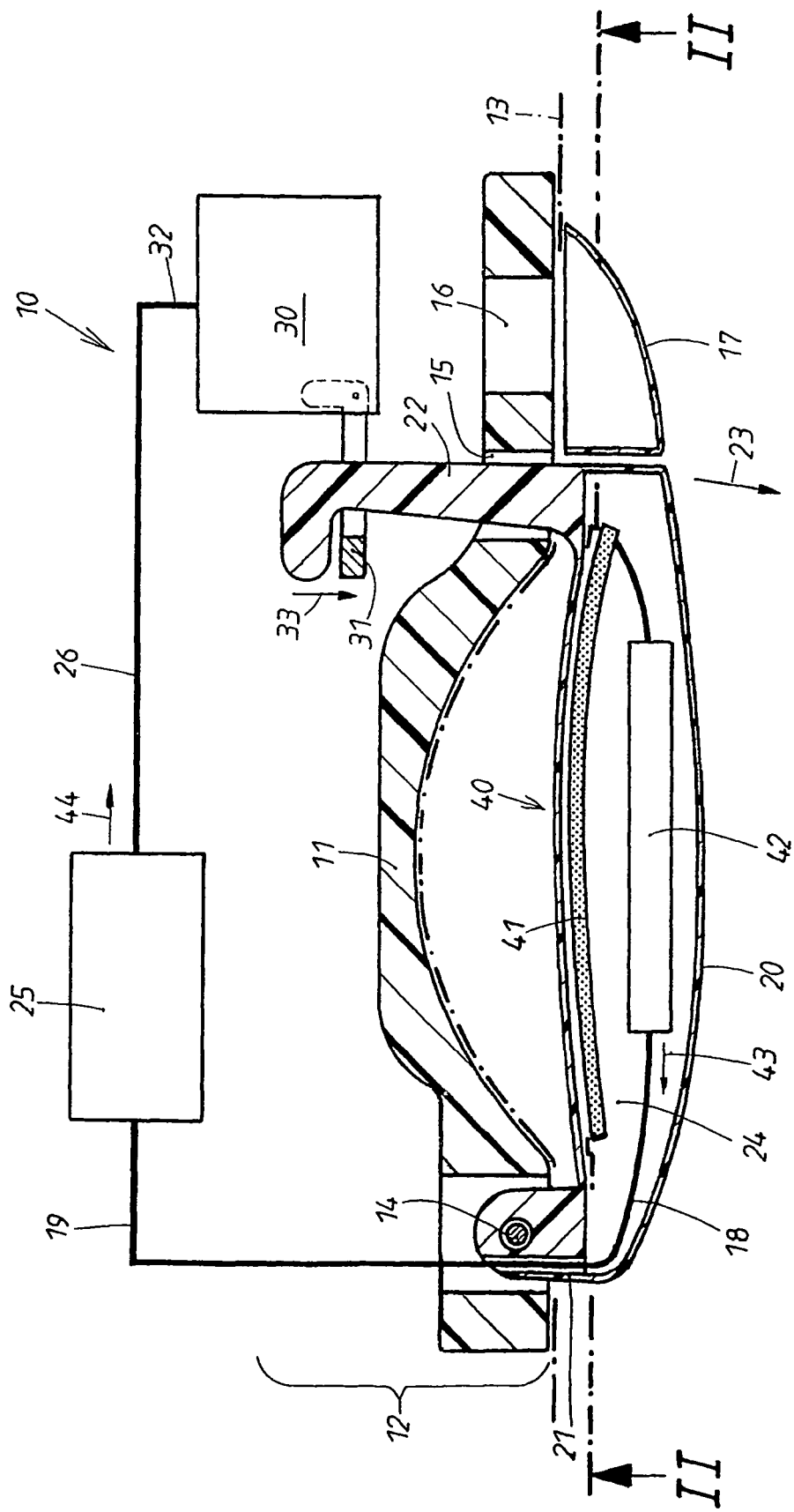

In the present case, we have an electromechanical device, designed as a closing device 10, in of the inventive external door handle shown in the exemplary embodiment. The closing device 10 comprises a bracket 11, which is mounted in the interior of a door 12 of a vehicle (not shown). Only the exterior panel 13 of the door 12 is shown in dash-dot line.

The closing device 10 also includes a handle 20. One end 21 of the handle 20 is supported pivotably in the bracket 11. The axis 14 of the pivot bearing is essentially vertical with respect to the door 12, for which reason the handle 20 is a so-called a "pull-handle". The other end 22 of the handle 20 has an extension with a hook at the end. The extension passes through an opening 15 in the exterior door panel 13 and in the bracket 11. The hooked end of the extension grips a mechanical input element 31 on a lock 30 installed in the door 12.

The lock 30 normally holds the door 12 in its closed position. The lock 30 can be in either one of two different operating positions, as desired, namely, a locked position and an unlocked position. When the handle 20 is pivoted in the direction of the arrow 23 in FIG. 1, the extension 22 carries the lock element 31 along with it in the direction of the arrow 33 in FIG. 1. When the lock 30 is in the unlocked position, this actuation 23 of the handle 20 is functionally effective. The lock 30 thus releases the door, and the door 12 can be opened. If, however, the lock 30 is in the locked position, the actuation 23 is not functionally effective; the lock element 31 is carried along in an "idling" manner, and the lock 30 thus does not release the door. In spite of the actuation 23, the lock 30 remains locked in its closed position.

In an emergency, the lock 30 can be switched from one state to another mechanically, e.g., by the use of a lock cylinder. Although this is not shown in detail, another opening 16 in the bracket 11 and in the exterior door panel 13 can be seen, in which a lock cylinder of this type could be installed. The lock cylinder can be actuated by an emergency key. The front end of the lock cylinder, where the key can be inserted and removed, can be integrated into a cover piece 17, which is attached to the bracket 11 and which is designed so that it is flush with the handle 20. In the normal case, the lock 30 is switched between the unlocked position and the locked position by electrical means. For this purpose, the lock 30 has an electrical input 32. A sensor 40 is the initiator of this electrical switching of the lock 30.

The sensor 40 responds to approach or contact and, in the present case, is located in the interior 24 of the handle 20. In the present case, the sensor 40 acts on the basis of capacitance and comprises at least one electrode 41, which is located in the interior 24 of the handle. At least several electronic components 42 of the sensor, mounted on a circuit board (not shown), are also present there.

The electrode 41 cooperates with other components of the vehicle and/or the environment to build up an electrical field. When an object arrives in this electrical field, the capacitance between the electrode 41 and the vehicle or its environment changes. This is registered by the associated electrical components 42 of the sensor. Signals, illustrated by an arrow 43 in FIG. 1, are transmitted by the electrical components. These signals 43 are transmitted over electric lines 18 in the area of the handle 20 and over an extension of those lines in the form of an electric cable 19 in the door 12 and in the vehicle to a control unit 25. This can be a central control unit 25, which acts on the various locks 30 in the various doors and hatches of the vehicle by way of numerous electrical connections 26. The electrical connection 26 is connected to the previously mentioned electrical input 32 of the lock 30 in question. Instead of an electrical connection 26, the control unit 25 could also act mechanically on a second input element (not shown) of the lock 30.

Figure 2:
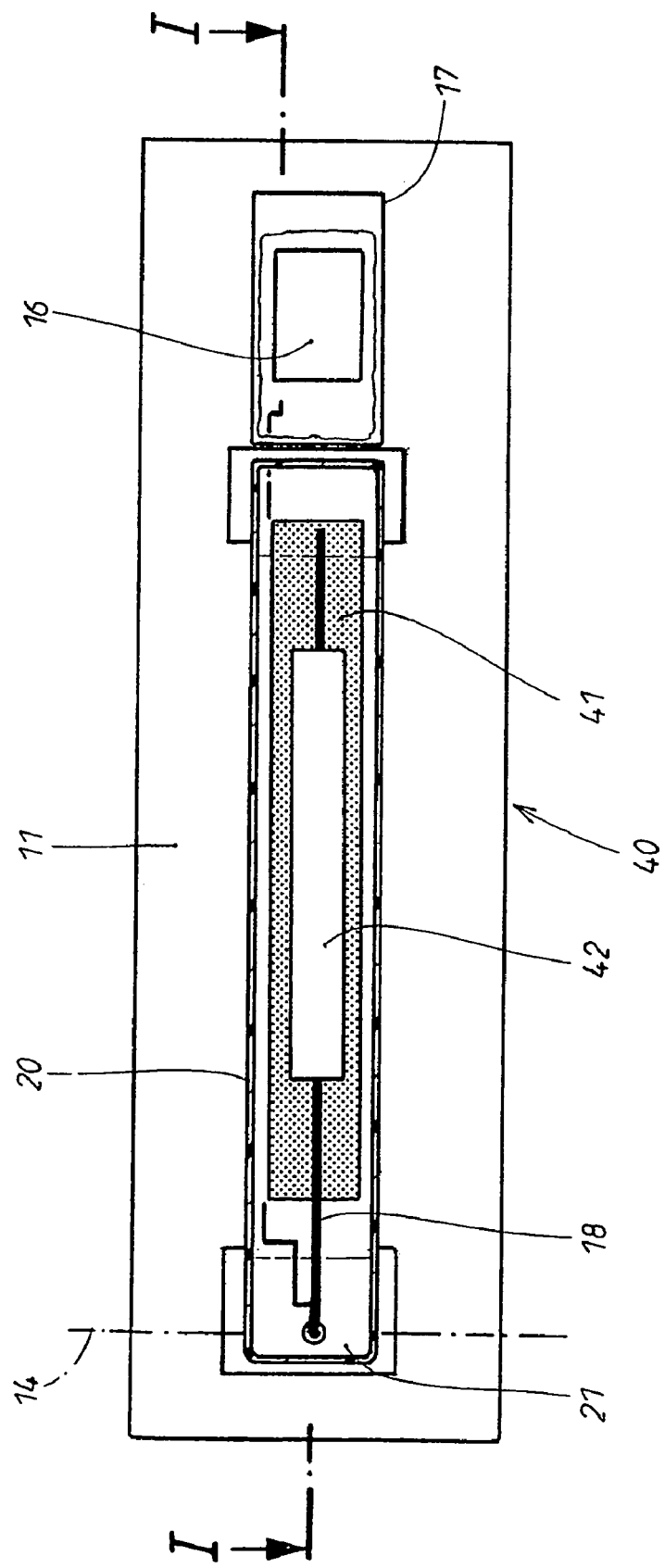
Figure 3:
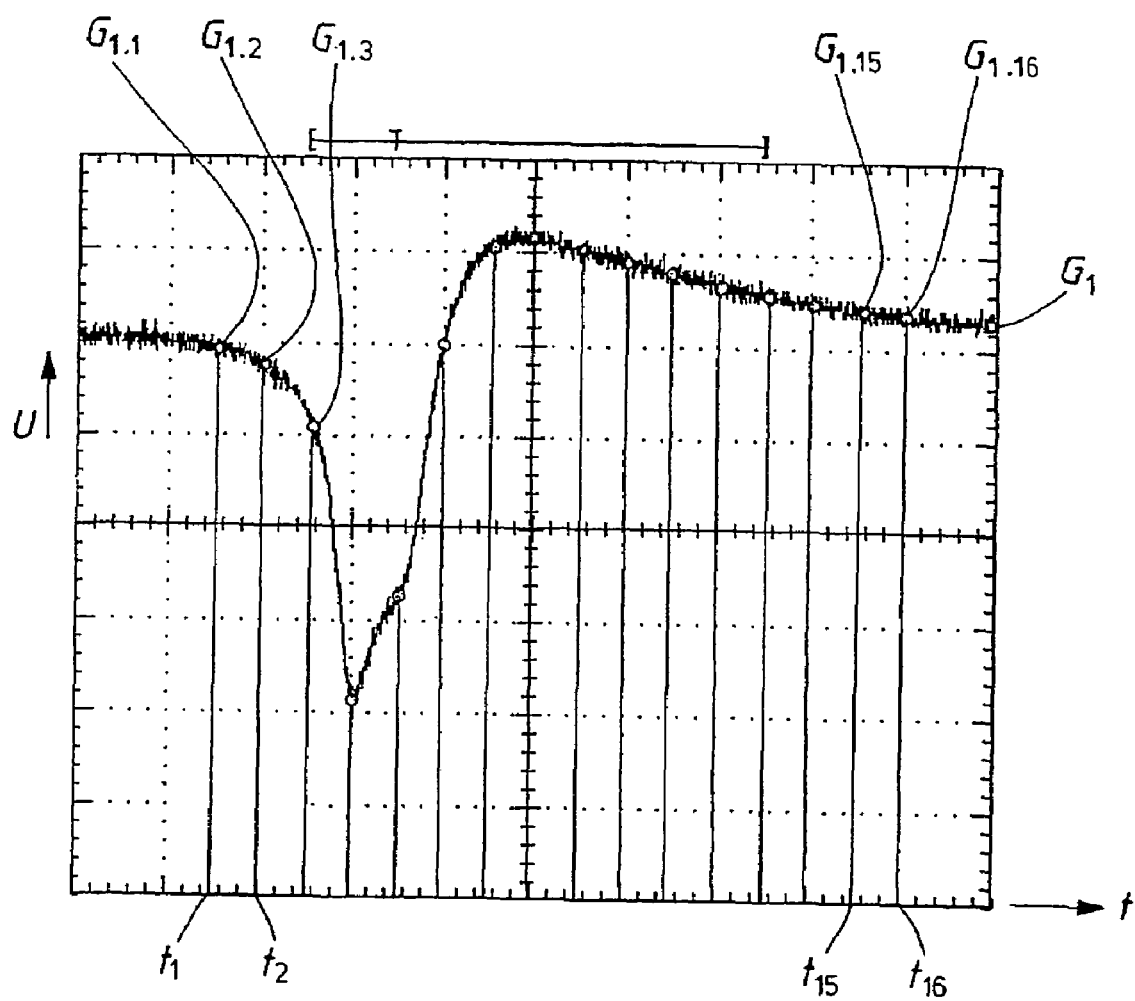
FIG. 3 shows a first diagram, which is typical of what happens when the grip of the external door handle shown in FIGS. 1 and 2 is actuated briefly.
Figure 4:
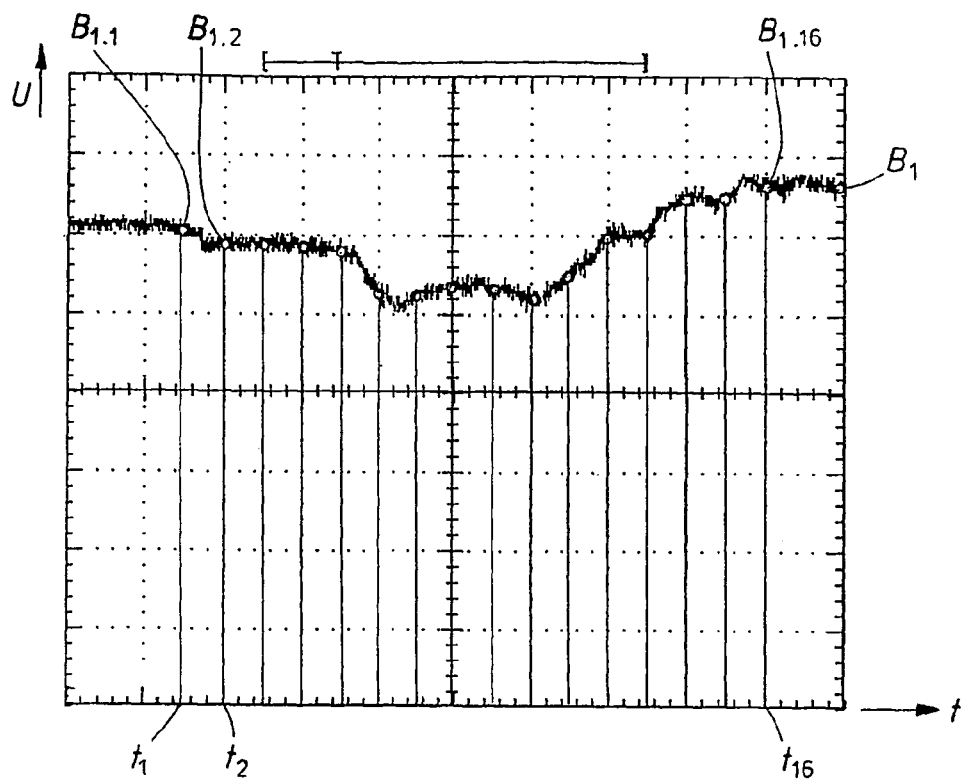
FIG. 4 shows a similar diagram, which is typical of what happens when rain in the form of a surge of water falls on the grip of the inventive external door handle.
Figure 5:
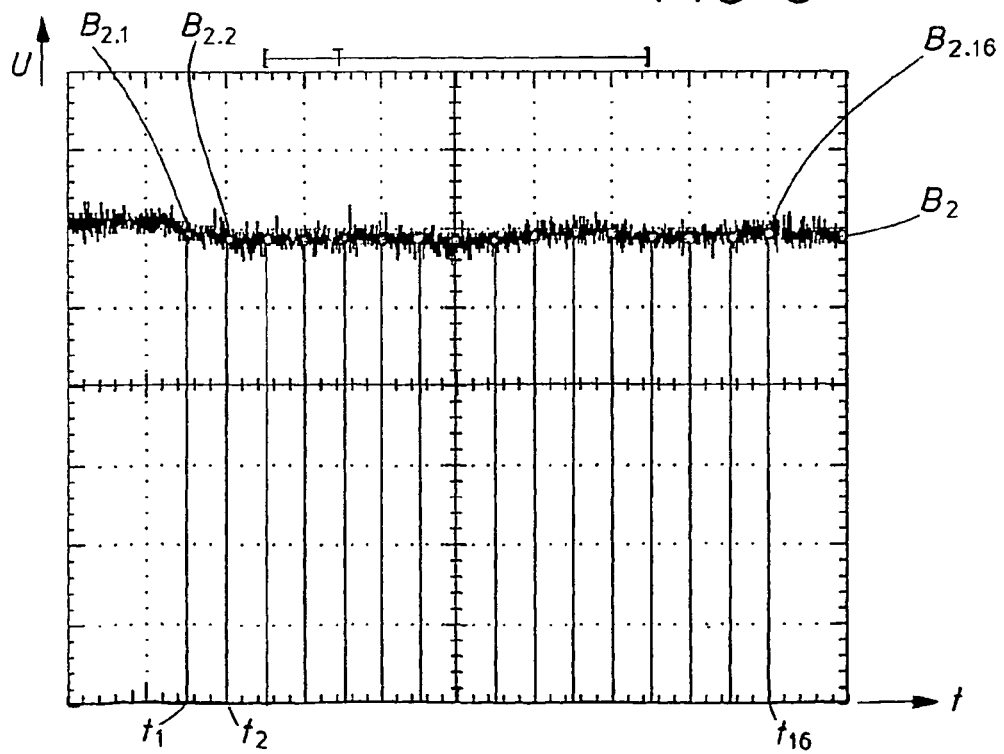
FIG. 5 shows a third diagram, which is typical of what happens when water spray strikes the area of the grip.

FIGS. 3-5 explain in greater detail what happens when actuation occurs. FIG. 3 shows the time change in voltage in the circuit of the components 42 as a human hand approaches the external door handle 20 according to FIGS. 1 and 2 and actuates it briefly.

First, a change in voltage is seen, namely, a change to the voltage $G_{1.1}$, at time $t_1$. From this point on, the sensor records the voltages at defined time intervals $t_2$ to $t_{16}$. These are the times at which the values $G_{1.2}$ to $G_{1.16}$, indicated in FIG. 3, are obtained over the course of this subsequent period. The inventive arrangement has already recorded numerous other data sets during an initial setup phase and stored them in a memory unit, which represents one of the electrical components 42 in the handle 20. When these data sets were recorded, the time change in the responding sensor was recorded at the same defined times $t_1$ to $t_{16}$, these being the times at which the data sets are evaluated. A set $G_1$ of good data $G_{1.1}$ to $G_{1.16}$ typical of actuation was also obtained, which is the same as or at least very similar to the actual data shown in FIG. 3.

The electronic components 42 also comprise a controller (not shown), which compares the incoming actual data $G_1$ with the stored data sets and, in the case assumed here, establishes agreement between them. A signal 43 then arrives at the control unit 25, which, if additional conditions are also satisfied, releases the lock 30 by way of the electrical connection 26.

One such additional condition for releasing is derived from the circumstance that access to the vehicle is to be granted only to authorized persons, not to someone without such proper authorization. The authorized person carries an identification transmitter, referred to in the following in brief as an "ID transmitter", for which a corresponding identification receiver, called in a similar manner the "ID receiver", is provided in the vehicle. Normally, an ID transmitter of this type is passive. It works when the authorized person simply approaches the vehicle. There is no need for the person to perform any action on the ID transmitter or with the ID transmitter. It is also conceivable, however, that an active ID transmitter could be used, such as an electronic remote-control key, which, in order to become active, must be operated by a button. In both cases, one-way or two-way communication takes place with the ID receiver. If these communications are successful, the successful outcome is reported to the control unit 25, which also receives the additional condition required for release. By way of the previously mentioned electrical or mechanical connection 26, the control unit then switches the lock 30 to its previously mentioned unlocked position. Then when the handle 20 is now actually moved in the direction of the arrow 23 in FIG. 1, the lock 30 releases the door 12.

As previously mentioned, the memory of the inventive sensor can contain not only the set $G_1$ of good data but also numerous other data sets, which are checked before the evaluation by the electronic components 42 results in the transmission of a release signal 43 to the control unit 25. Sets of data $B_1$ and $B_2$ can also be included, the time curves of which are explained in FIGS. 4 and 5.

FIG. 4 shows a curve $B_1$, which is obtained when a surge of water falls on the handle 20. This occurs when the vehicle is standing in heavy rain. Here, too, a first significant change in the recorded values occurs at time $t_1$ with value $B_{1.1}$. From then on, the voltage values $B_{1.2}$, etc, to $B_{1.16}$ are recorded at the additional times $t_2$, $t_3$, etc. The data of the $B_1$ data set have already been recorded in the previously mentioned initial setup phase and entered in the memory of the sensor. They are thus available during the later duty phase of the external door handle. When a heavy rain is falling during use, as indicated in FIG. 4, the data set $B_1$ is recorded at the defined times along the curve and compared by the controller with the previously stored additional data sets. If significant agreement is found with the previously stored "bad data" typical of foreign actuation, the control unit 25 will not release the lock 30. If the lock was already in its locked position, the actuation 23 of the handle 20 remains ineffective, as previously described.

FIG. 5 shows another set $B_2$ of "bad data", which is obtained when sprays of water strike the handle. The bad data $B_{2.1}$ to $B_{2.16}$ are also recorded in the memory of the inventive external door handle and are available for evaluation by the controller during the later duty phase. If the controller finds complete or nearly complete agreement between the actual data and data set $B_2$, no release occurs; the lock 30 remains in its locked position.

The inventive arrangement is applicable not only to a closing device but also to other electrical or electromechanical devices on vehicles. Another possibility, for example, involves a so-called start-stop switch for the vehicle's engine. A switch of this type comprises, again, a handle, which, when actuated, can be moved from a starting position to at least one other operating position when an authorized person actuates it intentionally. If the switch is actuated by an object which is not a human hand, the arrangement will detect this fact, and no release will occur. In spite of any possible actuation which might then still occur, the engine will not be switched from one to another of its various operating modes.

In addition to the capacitive sensor described above, it would also be possible to use other sensors known in and of themselves. One possibility would be to use an optical sensor. Another possibility would be to use sensors which can be actuated electromagnetically, e.g., sensors which act by way of radar.

It is important for the inventive arrangement to react as quickly as possible. For this purpose, it is recommended that the controller release the device for actuation as soon as the "begin" signal is received, but in fact actuation is not completed at this point. If, upon further evaluation, the controller arrives at a negative comparison, namely, that the actual data belong to a bad data set, the controller will then cancel the release. This is done so promptly that the actual actuation of the device will have no effect in this case either.

Normally, the various good data sets and/or bad data sets will have already been entered into memory by the manufacturer and are available to the buyer of the vehicle during the duty phase. It would also be possible, however, to give the arrangement the ability to learn. It is enough for this purpose to allow the setup phase to continue during the later use of the arrangement. The arrangement can identify whether current actual data being received are to be interpreted as bad data or as good data according to the following criterion.

If, namely, no concrete actuation of the device occurs after the actual data have been received, the arrangement can have this data set as bad data. Conversely, if actuation does occur after the actual data have been received, the arrangement can establish that the data are good. The arrangement can add these data to the memory and thus increase its ability to deal with future applications.

LIST OF REFERENCE NUMBERS

10 device, closing device
11 bracket
12 door
13 exterior panel of 12
14 pivot bearing of 20 on 11
15 opening in 11 for 22
16 opening in 11 for a lock cylinder
17 cover piece of 11
18 electric line for 43 in 20
19 electric cable for 43
20 handle
21 first end of 20
22 second end of 20
23 arrow of the pivoting movement of 20, actuation
24 interior of 20, empty space
25 control unit
26 electrical connection
30 lock
31 mechanical input element of 30, lock element
32 electrical input of 30
33 arrow of the carry-along movement of 31
40 sensor, capacitive sensor
41 electrode of 40
42 electrical components of 40
43 arrow of an electrical signal from 42, release signal
44 release signal of 25 for 32
$B_1$ first set of bad data (FIG. 4)
$B_{1.1}$ to $B_{1.16}$ data of $B_1$
$B_2$ second set of bad data (FIG. 5)
$B_{2.1}$-$B_{2.16}$ data of $B_2$
$G_1$ set of good data (FIG. 3)
$G_{1.1}$-$G_{1.16}$ data of $G_1$
$t_1$ time of first occurrence of a significant signal change in $G_1$, $B_1$, or $B_2$
$t_2$-$t_{16}$ additional defined times of $G_1$, $B_1$, or $B_2$

The invention claimed is:

1. Arrangement for actuating electrical or electromechanical devices (10) on or in a vehicle,
with at least one sensor (40), which responds to approach or contact;
with a memory for nominal data and with a controller, which compares the incoming actual data with the nominal data and, if the comparison is successful, releases the actuation (23) of the device (10),
wherein during a setup phase of the arrangement, at least one data set ($G_1$, $B_1$, $B_2$) of the signals ($G_{1.1}$-$G_{1.16}$, $B_{1.1}$-$B_{1.16}$, $B_{2.1}$-$B_{2.16}$) obtained over the course of time during the response of the sensor (40)

is recorded at a minimum of several defined times ($t_1$-$t_{16}$) and stored in memory, namely, a set ($G_1$) of good data ($G_{1.1}$-$G_{1.16}$) typical of actuation and/or a set ($B_1$; $B_2$) of bad data ($B_{1.1}$-$B_{1.16}$; $B_{2.1}$-$B_{2.16}$) typical of errors; in that during the later duty phase of the arrangement, a responding sensor (40) records an actual data set of analogous signals over the course of time at the same defined times ($t_1$-$t_{16}$) as those used during the setup phase; in that this actual data set is compared by the controller with at least one of the stored data sets ($G_1$, $B_1$, $B_2$); and in that the controller releases (44) the actuation of the device only if the actual data set agrees with the good data set ($G_1$) and/or is not the content of a bad data set ($B_1$; $B_2$).

2. Arrangement according to claim 1, wherein the memory holds a large number of good data sets ($G_1$).

3. Arrangement according to claim 1, wherein the memory holds a large number of bad data sets ($B_1$, $B_2$).

4. Arrangement according to claim 1, wherein, during the evaluation, the controller first checks all the sets of good data ($G_1$) and only then decides whether or not agreement or non-agreement with the actual data set is present.

5. Arrangement according to claim 1, wherein, during the evaluation, the controller first checks all the sets of bad data ($B_1$, $B_2$) and only then decides whether agreement or non-agreement with the actual data set is present.

6. Arrangement according to claim 1, wherein the device is a closing device (10) for doors (12) or hatches of the vehicle; and in that after release (44) has occurred, the closing device (10) opens or closes the door (12) or hatch upon actuation (23).

7. Arrangement according to claim 6, wherein the closing device (10) has a handle (20), which is used to actuate (23) the closing device (23) in the operating or closing direction; and in that at least several components (42) of the arrangement are integrated into the handle (20).

8. Arrangement according to claim 1, wherein the device is a start-stop switch for the vehicle's engine; and in that after release has occurred, the start-stop switch switches the engine from one to another of its various operating modes upon actuation.

9. Arrangement according to claim 1, wherein the sensor (40) acts on the basis of capacitance.

10. Arrangement according to claim 1, wherein the sensor is optically active.

11. Arrangement according to claim 1, wherein the sensor acts on the basis of electromagnetism or radar.

12. Arrangement according to claim 1, wherein the controller begins to release (44) the actuation (23) of the device (10) as soon as the signal ($G_{1.1}$, $B_{1.1}$, $B_{2.1}$) of the actual data set begins, but does not yet actually allow the actuation (23); and in that if a negative comparison is reached upon evaluation of the received actual data set, the controller cancels the release (44) of the actuation (23) and renders the actuation function inactive.

13. Arrangement according to claim 1, wherein an authorized person carries an active or passive identification transmitter (ID transmitter); in that the ID transmitter communicates with an identification receiver (ID receiver) in the vehicle; and in that if the communications between the ID transmitter and the ID receiver are successful, the actuation (23) of the device (10) is released (44).

14. Arrangement according to claim 13, wherein the controller starts to release the actuation (23) of the device (10) as soon as the signal ($G_{1.1}$, $B_{1.1}$, $B_{2.1}$) of the actual data set begins but does not yet allow the actuation (23); and in that if the communications between the ID transmitter and the ID receiver are unsuccessful, the controller cancels the release (44) of the actuation (23) and renders the actuation function (23) inactive.

15. Arrangement according to claim 1, wherein the setup phase can also continue during the later use of the arrangement; in that the arrangement also learns during the duty phase and identifies current actual data according to the following criterion and stores at least some of them, where incoming actual data not followed by a concrete actuation (23) of the device (10) are interpreted as bad data ($B_1$; $B_2$), whereas actual data are recognized as good data if an actuation (23) of the device (10) follows their reception.

* * * * *